United States Patent [19]
Hobson et al.

[11] Patent Number: 5,355,379
[45] Date of Patent: Oct. 11, 1994

[54] ERROR PROTECTION FOR VLC CODED DATA

[75] Inventors: Warren J. Hobson, Winchester; Martin P. Gold, Eastleigh, both of England

[73] Assignee: National Transcommunications Limited, Winchester, England

[21] Appl. No.: 961,910

[22] PCT Filed: Jul. 12, 1991

[86] PCT No.: PCT/GB91/01164
§ 371 Date: Jan. 7, 1993
§ 102(e) Date: Jan. 7, 1993

[87] PCT Pub. No.: WO92/01252
PCT Pub. Date: Jan. 23, 1992

[30] Foreign Application Priority Data

Jul. 13, 1990 [GB] United Kingdom ............ 9015426

[51] Int. Cl.⁵ ..................... G06F 11/00; H04L 1/00
[52] U.S. Cl. ........................... 371/54; 371/31
[58] Field of Search .............. 371/54, 31, 55, 56, 371/68.2, 72, 42; 340/825.01, 825.2, 825.21; 341/67, 65, 94

[56] References Cited

U.S. PATENT DOCUMENTS

| | | | |
|---|---|---|---|
| 3,872,430 | 3/1975 | Boudreau et al. | 340/146.1 |
| 3,873,920 | 3/1975 | Apple, Jr. et al. | 325/41 |
| 4,723,246 | 2/1988 | Weldon, Jr. | 371/42 |
| 4,837,617 | 6/1989 | Brusewitz | 358/133 |
| 5,016,010 | 5/1991 | Sugiyama | 341/67 |
| 5,148,271 | 9/1992 | Kato et al. | 358/133 |
| 5,151,784 | 9/1992 | Lavagetto et al. | 358/136 |

FOREIGN PATENT DOCUMENTS

| | | | |
|---|---|---|---|
| 0279909 | 8/1988 | European Pat. Off. | H03M 7/40 |
| 0370291 | 5/1990 | United Kingdom | H04L 7/04 |

OTHER PUBLICATIONS

Han et al "Feedback Codes with Uniformity Banded Codeword Lengths and Zero-Error Capacities" IEEE Trans. on Information Theory vol. 37 No. 3 May 1991.

*Primary Examiner*—Robert W. Beausoliel, Jr.
*Assistant Examiner*—Joseph E. Palys
*Attorney, Agent, or Firm*—Watson, Cole, Grindle & Watson

[57] ABSTRACT

Digital data, in the form of blocks delimited by end-of-block words, that is to be coded into variable length codewords, is protected against errors occurring within a block, as well as errors crossing block boundaries, by modulating the respective end-of-block words with a bit, or bits, of a larger reference pattern which bit, or bits, have been conditioned to carry information on the content of VLC codewords coding a corresponding (eg. preceding) data block. The "modulation" may be by means of selecting between different possible end-of-block words dependent upon the value of the conditioned reference pattern bit, or bits, or by means of appending the conditioned bit(s) to the end-of-block word. The reference pattern may be a repeated pseudo-random sequence.

39 Claims, 7 Drawing Sheets

ERROR PROTECTION FOR VLC CODED DATA

The present invention relates to the field of codes using variable length codewords and, in particular, to error protection for code streams comprising variable length codewords.

Bit rate reduction techniques are coming into wide use for the electronic transmission, distribution and storage of a wide range of media including audio, text, still and motion video.

Figure 1:
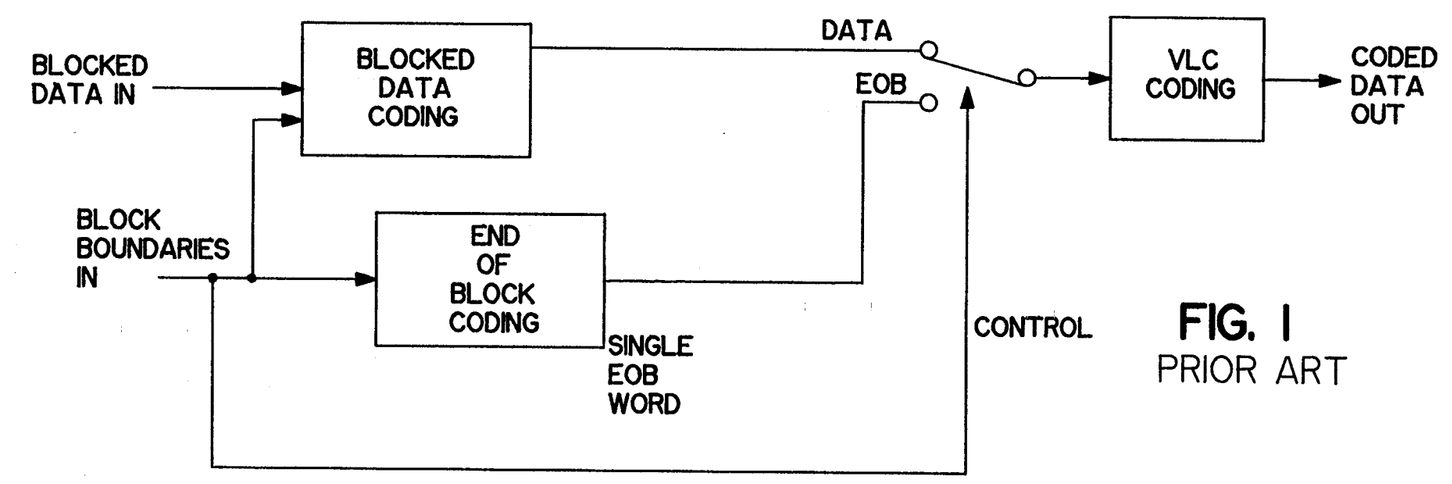
FIG. 1 is a block diagram of a prior art basic "block-structured" VLC coder.

Many of the coding algorithms used to achieve a bit rate reduction rely on the use of variable length codewords to achieve data compression. FIG. 1 shows a block diagram of a typical coder in which "block structured" digital data is coded into variable length codewords.

Digital errors (from the transmission or storage medium) give rise to difficulties in the decoding of these variable word length code words (VLC) due to the problem of synchronization loss at the decoder. The nature of many VLC streams, such as Huffman code streams, is such that a single error will commonly desynchronize the decoding process over a number of symbols before self-resynchronization occurs. This causes n encoded symbols to be incorrectly interpreted as m decoded symbols.

Early techniques for addressing this problem relied on the periodic insertion of multi-bit synchronizing patterns to allow re-alignment of the decoder (where $m \neq n$), perhaps also with optimization of the variable length code tables to reduce the number of symbols "n" over which synchronization loss occurs. The overhead of these techniques often impaired the efficiency of the compression processes. Further, because the synchronizing words were inserted at periodic intervals, resynchronization performance was limited by the spacing of these words; widely spaced words offered limited re-synchronization capability whereas more closely spaced sync words degraded the compression gain achieved through the use of variable length codewords.

Figure 2:
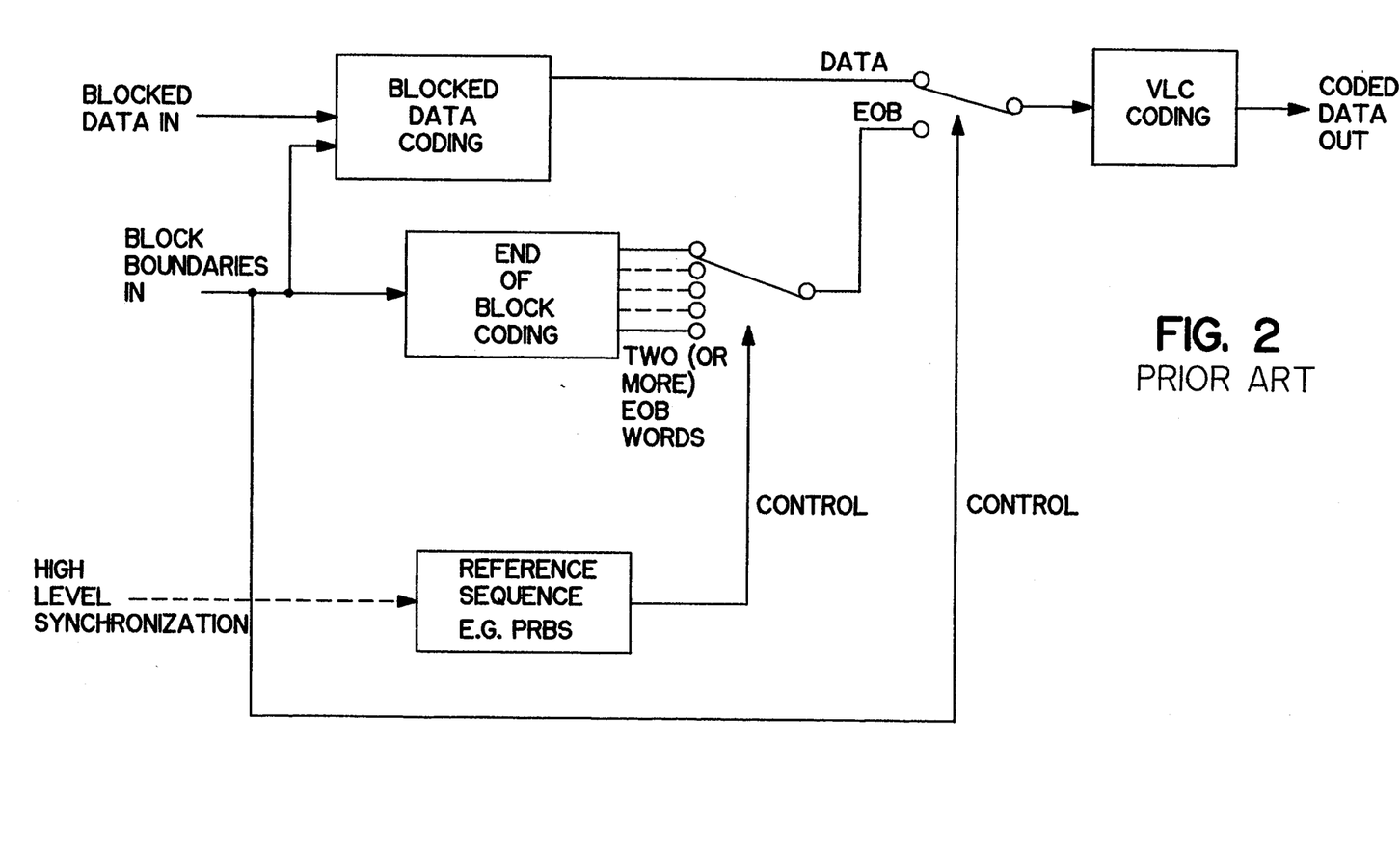
FIG. 2 is a block diagram of a prior art enhanced "block-structured" VLC coder in which each end-of-block word is modulated by a bit of a reference pattern.

In European patent application, EP-A-0370291, in the name of Telettra, an alternative approach is suggested. The Telettra application suggests generating a repeating pseudo-random sequence and using successive bits of the sequence to modulate, or select between different possible, block end words (ie. words or bits used to mark the end of a block of variable length codewords). A system of this type is illustrated in block diagrammatic form in FIG. 2.

By regularly placing into the codestream information related to bits of a pseudo random sequence it becomes possible in the Telettra system to detect errors which carry across block boundaries. Such "inter-block" errors are detected because of the effect they have on the pseudo-random sequence information carried in the codestream and the extent of such an inter-block error is assessed by determining how far apart in the pseudo-random sequence are the two correctly recognized bits recovered from the codestream on either side of the error.

However, there are a number of advanced VLC schemes now in widespread use which have improved self-resynchronization properties. When schemes of this sort (such as the B2 code also developed by Telettra) are used then, typically, around 80–90% of single errors do not carry across block boundaries. Such "intra-block" errors will not be detected by the above-mentioned prior art schemes and, although confined to one block, will often have a disturbing effect in the fully encoded data.

For example, in a Hybrid-Discrete Cosine Transformation coding scheme used to compress video data, blocks of 8 by 8 or 16 by 16 pixels are commonly coded into blocks of VLC words, separated by End Of Block codewords. Intra-block errors within these VLC blocks can commonly lead to disturbing 8 by 8 pixel artefacts within the decoded image over a significant number of frames.

Embodiments of the present invention allow the detection of intra-block errors as well as interblock errors. The scheme allows many of the error events described above, affecting only information within the protected blocks, to be detected and processed at the decoder (eg. in the Hybrid DCT scheme by concealing erroneous blocks with data from the previous frame). This is achieved by producing a reference pattern, modulating bits of the reference pattern to reflect the content of the VLC codewords coding data blocks and using these modulated reference pattern bits to modulate the end of the block words.

The reference pattern bits may be modulated by various different parameters which characterize the VLC codewords coding a corresponding data block. One suitable characterizing parameter is the parity of the bits of the VLC code words coding a data block. The parity of the bits of the VLC code words is a 1-bit quantity and is a modulo 2 count of the number of binary "1"s occurring in that group of VLC codewords in the more general case the modulo n count of the bits of the VLC codewords could be used as the characterizing parameter where $n = 2^m$, and m is an integer. Depending upon the value of n the modulo n count may be a multi-bit quantity, in which case it would be necessary for each value of this characterizing parameter to modulate a plurality of bits of the reference pattern. For example, if the characterizing parameter were to be the modulo 4 count of the number of binary "1"s in the VLC codewords coding a particular data block, then it would be necessary to modulate two reference pattern bits with the value of the modulo 4 count and to use those two reference pattern bits to modulate the end-of-block word for that data block.

Similarly another possible characterizing parameter is the modulo n count of the number of VLC codewords coding a data block.

It is to be understood that in the present application when a reference is made to modulating end-of-block words this refers both to the situation where there are a plurality of block words and the "modulation" selects which of those words should be transmitted/output and to the situation where the "modulation" adds one or more bits to the end-of-block word that otherwise should have been transmitted (ie. an n-bit end-of-block word is here "modulated" by bits xy through the addition of bits xy to the end-of-block word, for example at the end thereof, thus producing an n+2 bit end-of-block word).

The present invention achieves a more efficient detection of errors in variable length codestreams, whilst maintaining a low coding overhead, by distributing synchronization information throughout the variable length codestream, on a regular basis, without the periodic insertion of whole synchronization words, and conditioning the synchronization information to reflect the content of the codestream.

The present invention provides a method and apparatus for error protecting a digital bitstream, the digital bitstream comprising a plurality of variable length codewords (VLC) coding blocks of data, said blocks of data being delimited by end-of-block words (EOB), wherein the end-of-block words (EOB) are modulated by single, or small groups of, bits of a reference pattern, which reference pattern bits correspond to only a portion of the reference pattern, characterised in that the reference pattern bits modulating each end-of-block word are conditioned to carry information relating to a corresponding data block as described by a portion of the codestream.

The present invention also provides an error-protected digital bitstream comprising variable length codewords encoding blocks of data delimited by end-of-block words, the end-of-block words being modulated by single, or small groups of, bits of a reference pattern, said single, or small groups of, bit corresponding to only a portion of the reference pattern, characterized in that the reference pattern bit or bits modulating each end-of-block word are conditioned to carry information relating to a portion of the codestream coding a corresponding data block.

The present invention further provides a decoding method and apparatus complementary to the above encoding method and apparatus.

The modulating reference pattern bits are conditioned so as to carry information on the value of a parameter characterizing the VLC words coding the data in a corresponding data block. Characterizing parameters may be related to the properties of all bits/words, or only selected bits/words, of the VLC words coding a given data block.

For simplicity of design of the apparatus it is preferred to modulate respective end-of-block words with a reference data bit or bits conditioned to carry information on an adjacent data block.

Features and advantages of the present invention will become clear from the following description of an embodiment thereof, given by way of example, and the accompanying drawings, in which:

FIG. 5 illustrates the relationship between the structure of the data and the structure of the VLC codestream error-protected according to the invention, in which:

The error protection scheme of the present invention operates by distributing, through a stream of variable length of codewords encoding data blocks, information relating both to a resynchronizing reference pattern and to the content of the codestream coding the data blocks. The general characteristics of the resynchronizing patterns preferred for use in the invention are described below.

The reference pattern is chosen so as to ensure that a small "window" of bits taken at any point in the sequence uniquely identifies the location of the window within the resynchronizing (reference) pattern. Also, for a pattern consisting of a repeated sequence, the cycle time (period) of the pattern is chosen to be greater than the expected span of any anticipated data loss.

One type of reference pattern, which has been found to be useful in putting an embodiment of the present invention into practice, uses a repeating pseudo-random sequence of binary digits.

In a video data compression scheme using such a repeated pseudo-random sequence, of 4096 ($2^{12}$) bits in length, to implement the error protection method of the present invention, a "window" of size covering at least 12 bits of the pattern enables the location of the window within the reference pattern to be identified. For reference patterns consisting of a repeating of $2^n$ bits of a pseudo-random sequence a window of size covering n bits of the reference pattern will uniquely locate the position of the window within the pattern.

In the general case, where the reference pattern need not be a pseudo-random sequence, the size of the window depends on the properties of the particular reference pattern being used.

According to the present invention the data to be coded into variable length code words is treated as being divided into blocks or groups of blocks. One or more bits of the reference pattern are associated with each respective data block so as to distribute the reference pattern data through the coded bitstream. More than one bit of reference pattern data may be associated with a respective data block, but the larger the size of each group of reference pattern bits the more the data rate for "useful" data in the output signal is reduced.

Some types of data may by their nature possess a regular "blocked" structure (such as, for example, video signals described by compression schemes using the 2-dimensional Discrete Cosine Transformation, DCT) and in such cases it is convenient to make use of the "natural" block structure of the data when distributing reference pattern bits through the datastream. If the input data is not already divided into blocks in this way then an artificial division of the data into blocks may be made before associating the data with reference pattern bits.

The size of the data blocks need not be kept constant since the end of each data block will be indicated using an end-of-block word (EOB). The end-of-block word may be a single bit (ie. "0" or "1").

According to the present invention the single, or small groups of, reference pattern bits may be considered to be associated with data blocks in two senses. Firstly, the reference pattern bit or bits are conditioned so as to carry information relating to the VLC codewords coding data in a data block, $D_I$, and secondly, the conditioned bit or bits are used to modulate an end-of-block word delimiting a data block, $D_M$. In the simplest cases $D_I$ and $D_M$ are the same, or adjacent, data blocks.

The conditioning of the reference pattern bits may be performed in a variety of ways but in general will involve combining the reference pattern bit(s) with a signal indicative of a parameter of the VLC codewords coding the associated data block. Methods of combination such as addition or subtraction are relatively simple to implement. A number of different parameters could be used for characterizing the VLC code word data but the preferred parameter is parity. A signal indicative of parity may be generated either by considering all of the bits coding the data block or, in order to reduce the amount of processing required, only a subset of the relevant bits of the VLC codestream may be used, e.g. the most significant bits of the VLC words coding the block.

One embodiment of a coder according to the present invention will now be described with reference to FIG. 3 of the drawings. In this embodiment the reference pattern is a pseudo-random binary sequence and the reference pattern bits are conditioned by being input to an exclusive OR whose other input is a signal indicative of the parity of the bits of the VLC words coding a preceding data block. Furthermore in this embodiment there are two or more possible end-of-block words, EOB, which could be used to delimit each data block and the conditioned reference bits are used to choose the actual EOB word to be used.

Figure 3:
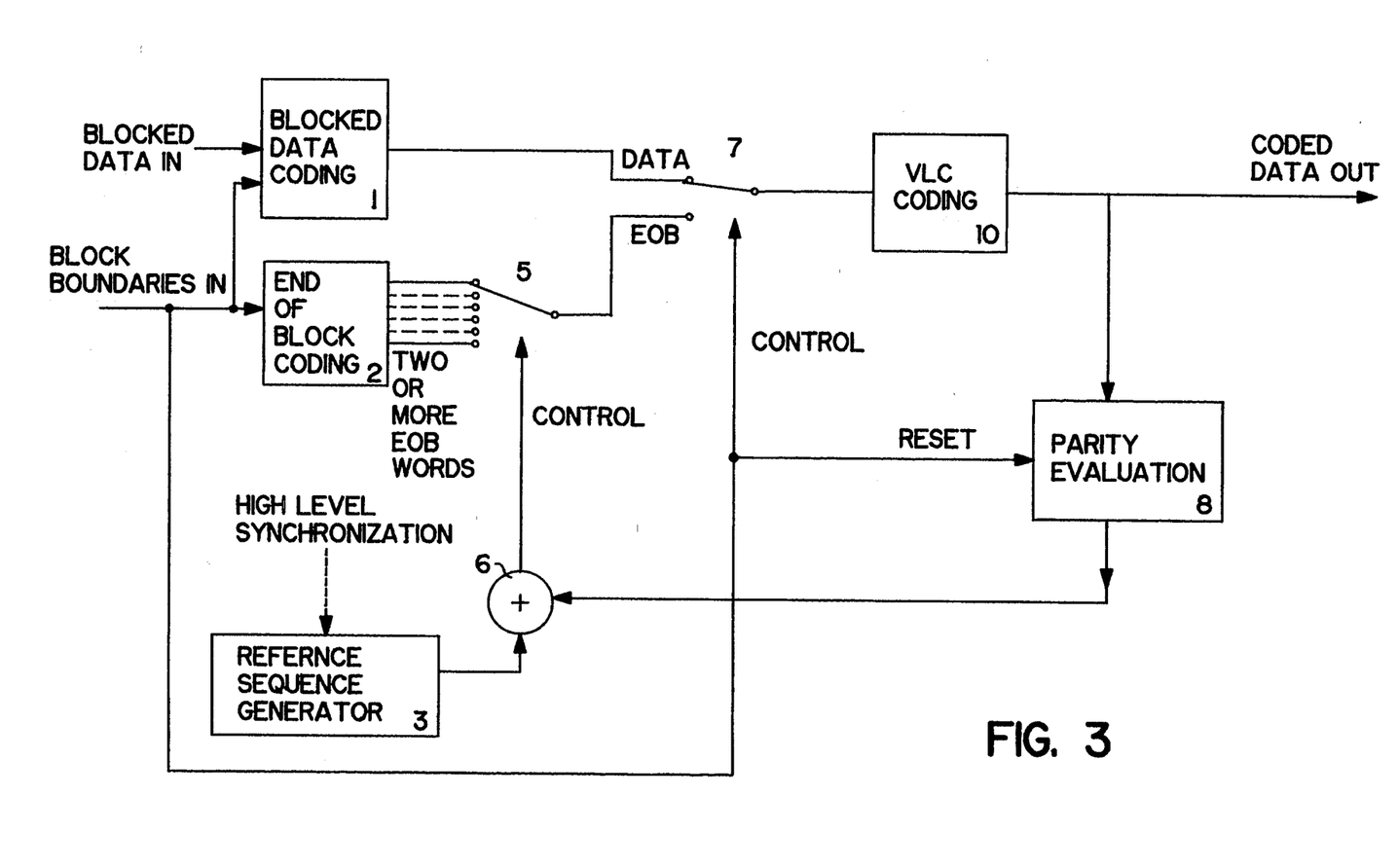
FIG. 3 shows, in block diagrammatic form, one embodiment of an encoder according to the present invention.

The data input to the coder of FIG. 3 is already block structured (either by its nature or through a pre-processing stage) and a signal containing information on the location of the block boundaries is also input to the coder. The data blocks are coded in a coding unit 1 into a set of symbols for later encoding into variable length codewords. In the case where the input data represents video information the coding unit 1 could implement, for example, a discrete cosine transformation (DCT) coding and a quantisation function.

The input block boundary signal is processed in an end-of-block coding unit 2 so as to produce an end-of-block word, EOB, for each data block. As illustrated in FIG. 3 there are two or more different possible end-of-block words or symbols all of which are generated by EOB coding unit 2 for each data block and one of which is selected by a control signal. However, the control signal could be used instead to condition the EOB coding unit 2 to generate only the EOB word selected for that particular data block.

The data block and the selected end-of-block words are multiplexed by a switch 7 under the control of the input block boundary signal. The multiplexed signal is then coded by a variable length coder 10. The coded data is output for transmission, storage, or the like.

The control signal used for selecting the end-of-block word to delimit a given data block is generated as follows. A reference sequence generator 3, in this case a pseudo-random binary sequence generator (such as a linear feedback shift register) is provided and, optionally, synchronized to the input data using a high level external synchronization signal. Where the input signal represents video data the external synchronization signal could be, for example, a frame or stripe synchronization pulse. In this embodiment the reference sequence generator 3 is set up to output a repeated pseudo-random binary sequence one bit at a time to an input of an exclusive OR 6. The other input of the exclusive OR 6 is provided by a signal indicative of the parity of the bits of the VLC code words coding the preceding data block. This parity signal is generated by a parity evaluation unit 8 operating on variable length codewords encoding the previous data block (but excluding the end-of-block word delimiting that data block). Thus the control signal output from the exclusive OR 6 is indicative both of the value of a bit of the reference sequence and of the parity of the bits coding the previous data block.

Figure 4:
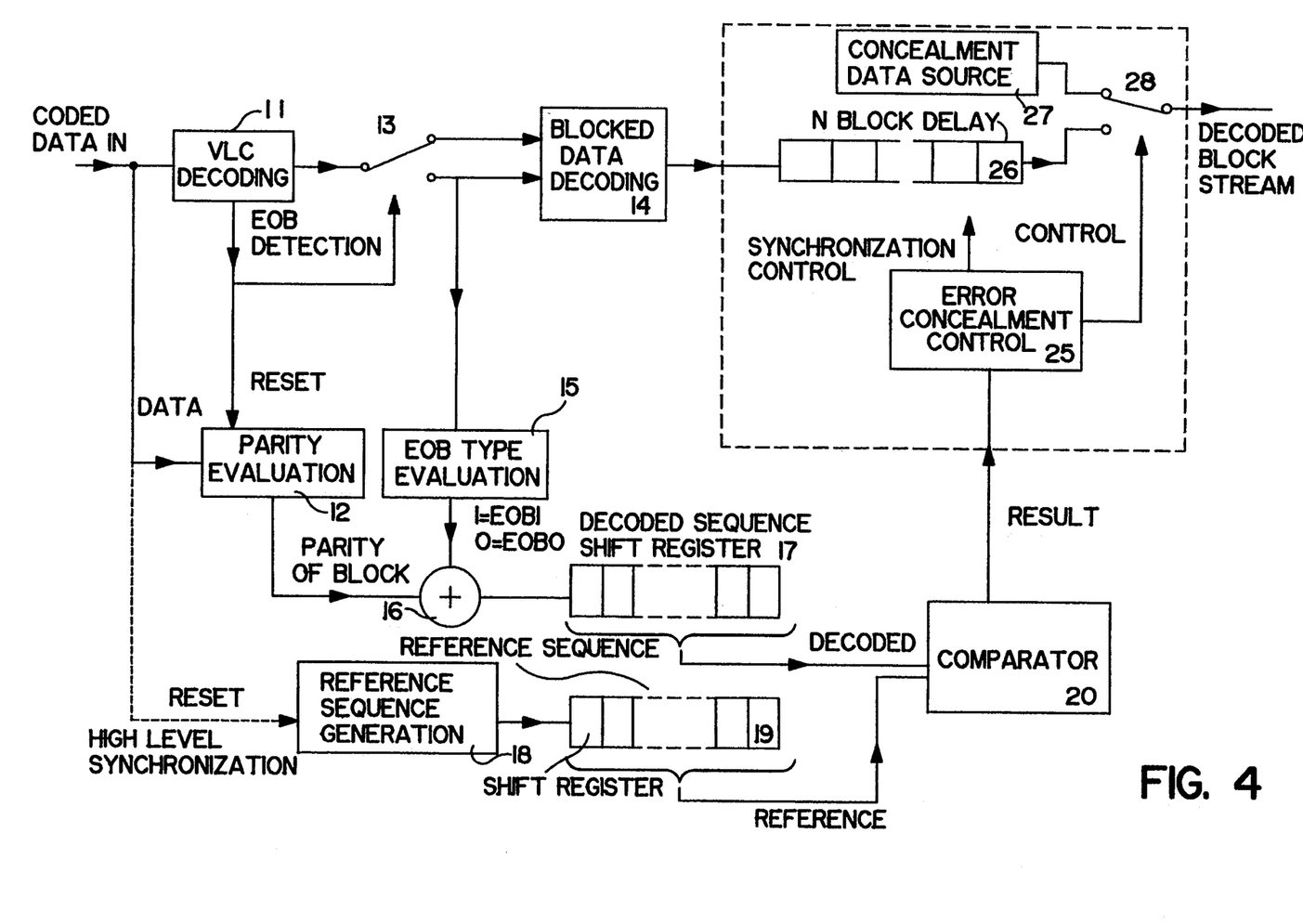
FIG. 4 shows, in block diagrammatic form, one embodiment of a decoder complementary to the encoder of FIG. 3.

A decoder embodiment complementary to the coder of FIG. 3 is shown in FIG. 4.

In the decoder of FIG. 4 the input coded data is fed both to a variable length codeword decoder 11 and to a parity evaluation unit 12. The VLC decoder 11 decodes the data by a method complementary to that used by VLC coder 10 in the coder. A signal indicative of detection of EOB words is output from the VLC decoder 11 to control a switch 13 and is also output to the parity evaluation unit 12 which analyses the input coded data so as to evaluate parity of the VLC words coding each data block (excluding the delimiting EOB word). The switch 13 is controlled to feed data block symbols to a data block decoder 14, which implements a decoding process complementary to the coding performed in the coding unit 1 of the coder, and to feed end-of-block words to a device 15 which identifies the type of each EOB word. In the example shown in FIG. 4 there are only two possible types of end-of-block word, EOB0, and EOB1, and unit 15 outputs a binary "0" when EOB0 is identified and a "1" when EOB1 is identified.

The EOB word type signal output from EOB type evaluation unit 15 is fed to an exclusive OR 16, the other input of which is a signal, from parity evaluation unit 12, indicative of parity of the bits coding the previous data block. The successive signals output from the exclusive OR 16 are fed to a shift register 17. These signals represent a group of decoded sequence bits and should match the corresponding group of reference sequence bits used at the coder.

The decoded data may contain errors arising from the channel (e.g. transmission or storage medium) through which it has passed and from loss of synchronization at the decoder (ie. VLC decoder 11 incorrectly interpreting n data blocks as being m data blocks). These errors may extend across block boundaries (inter-block errors) or be contained within individual data blocks (intra-block errors). Either type of error is likely to result in a corruption of the information modulating the successive EOB words and thus the decoded sequence of bits written into shift register 17 will not match the original reference sequence bits in the event or errors occurring. Accordingly, both intra-block and inter-block errors may be detected by generating the reference sequence afresh at the decoder and comparing it with the decoded sequence.

In the FIG. 4 decoder a reference sequence is generated by a pseudo-random binary sequence (PRBS) generator 18, such as a linear feedback shift register, and is fed into a shift register 19. The reference sequence generated at the decoder should be synchronized with the reference sequence distributed through the incoming coded data.

One of the various ways in which this can be done is using an input high-level external synchronization signal as shown (in dashed lines) in FIG. 4.

The bits of the locally generated reference sequence are output from shift register 19 to a comparator 20 for comparison on a bit-by-bit basis with the decoded sequence bits held in shift register 17. The comparator 20 detects discrepancies between the decoded sequence and the reference sequence and thereby identifies data blocks affected by errors. In preferred embodiments of the invention this information can be used to select the data blocks to which error correction and/or concealment should be applied.

In FIG. 4 a possible error concealment arrangement is shown (boxed by dashed lines) in which an error concealment control unit 25 receives information from the comparator 20 about which data blocks are affected by errors. A number, N of decoded data blocks are held in a delay 26 and the error concealment control 25 controls a switch 28 so as to selectively output a decoded data block from delay 26, or a replacement block from a source of concealment data 27, dependent upon the output from the comparator 20.

The source of error concealment data will vary depending upon the type of data being processed. In the case of data where portions of the datastream are correlated with one another, such as video data, the source of error concealment information may be, for example, a memory or store holding previously decoded data (e.g. from the previous frame of the video image).

In a case where it is possible to uniquely identify within the reference pattern the location of a group of bits over a given size ("window"), the comparator 20 may compare the decoded sequence and the locally generated reference sequence over a group of bits the same size as, or larger than the window so as to identify the location of the compared bits within the overall reference pattern and allow gross misalignment errors to be detected (ie. errors arising because the VLC decoder 11 has incorrectly interpreted n data blocks as m data blocks). In the decoder embodiment of FIG. 4 the shift registers 17 and 19 are provided to enable a group of bits to be held for comparison, the size of that group being greater than the "window" for the pseudo-random binary sequence being used. The error concealment control 25 is adapted to "resynchronize" or "realign" the data blocks (ie. correct the perceived number of data blocks).

In order to further clarify the operations of coding and decoding data, FIG. 5 illustrates how the structure of the original data alters during a typical simple coding and complementary decoding process according to the present invention. The process could be implemented using the coder of FIG. 3 and decoder of FIG. 4.

Figure 5A:
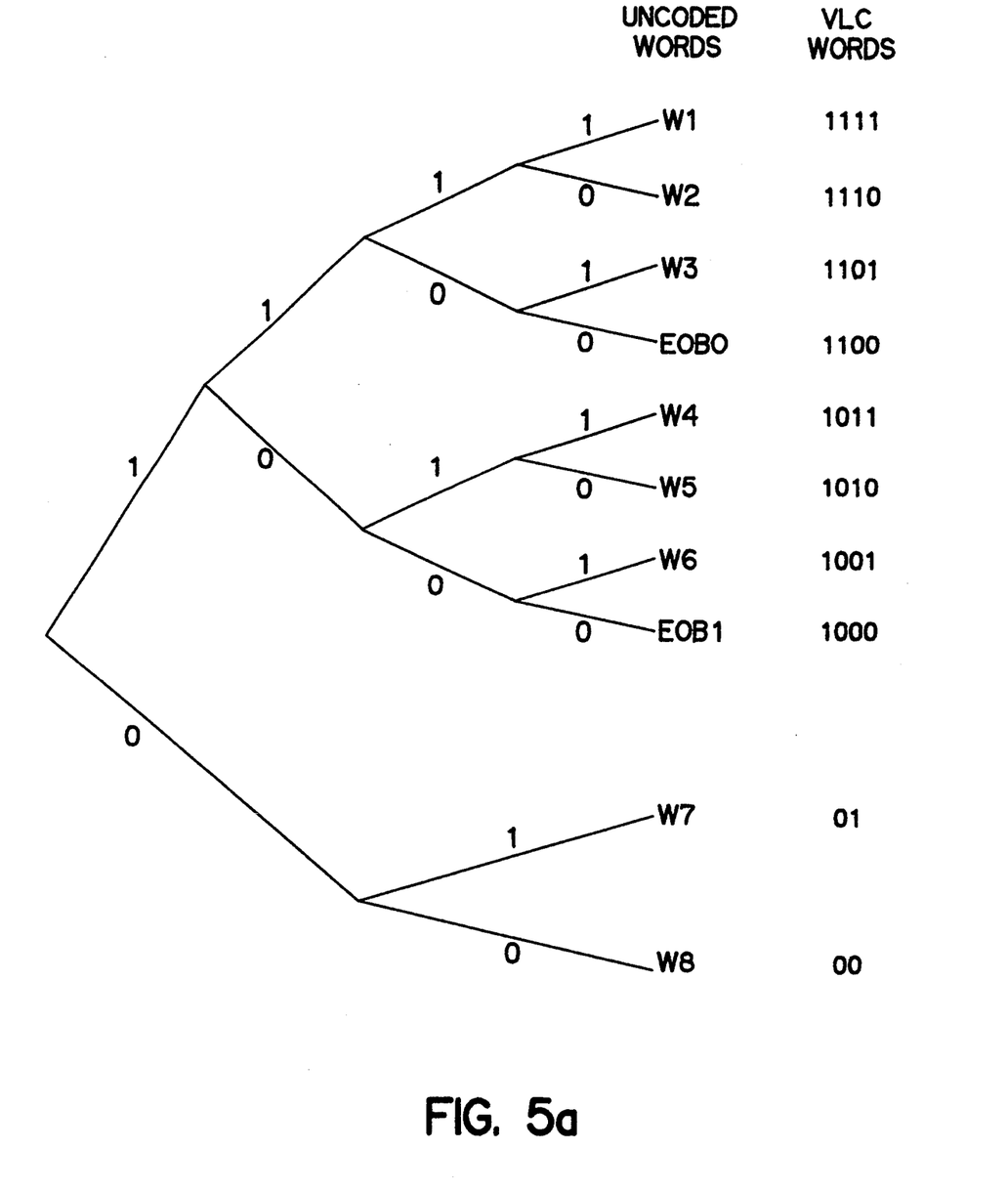
FIG. 5a shows an example of a variable length codetable for VLC coding blocks of input 4-bit words.

FIG. 5a illustrates the codetable of a simple code producing variable length codewords. In this code input data is coded four bits at a time into codewords which may be two or four bits in length: end-of-block words and data words W1 to W6 are coded into 4-bit code words and data words W7 and W8 are coded into 2-bit code words.

Figure 5B:
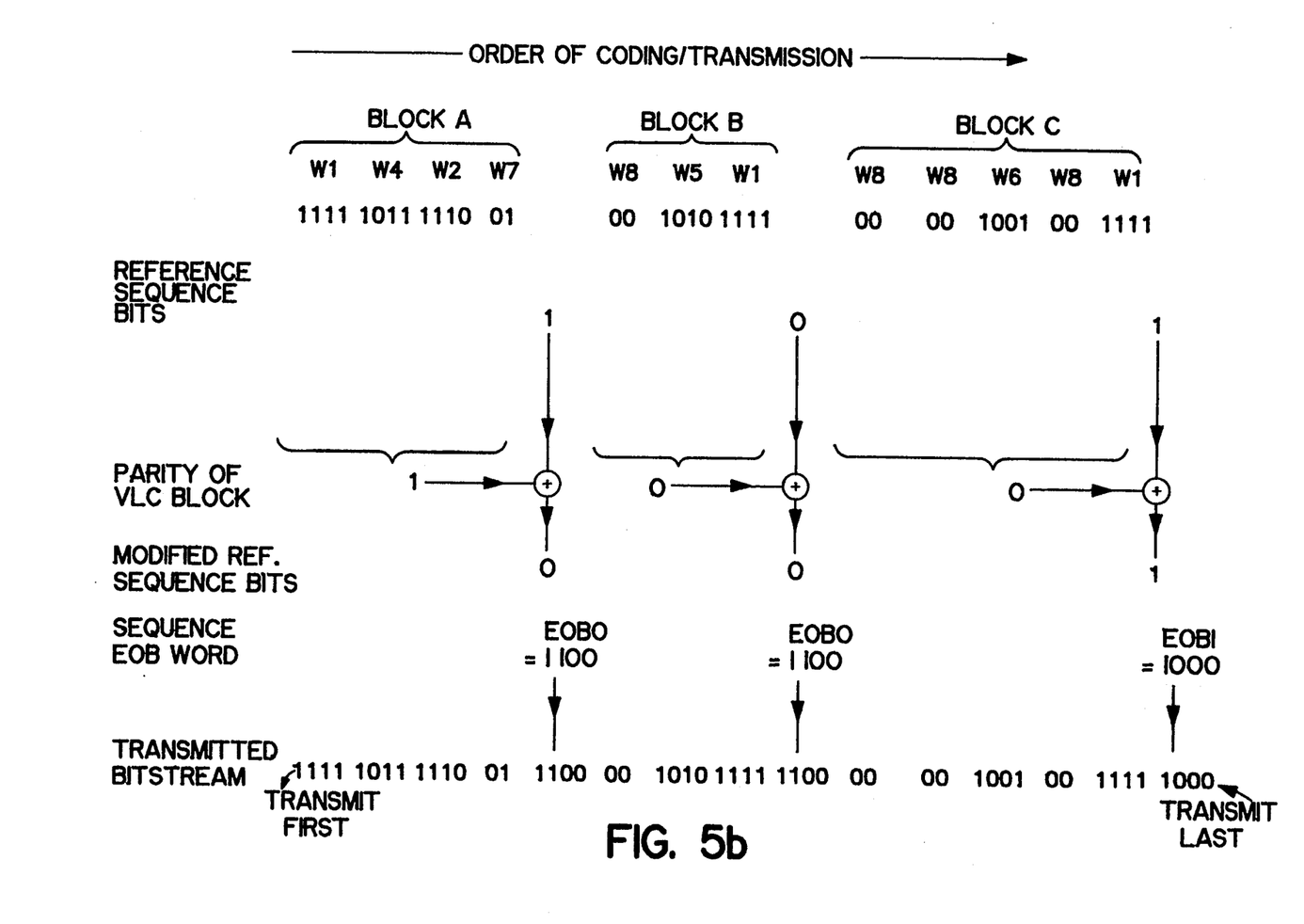
FIG. 5b illustrates how the structure of the data changes in one example of a coding process according to the present invention.

FIG. 5b shows how the structure of data changes as it is coded, using the codetable of FIG. 5a, and error protected according to one embodiment of the invention. In this example the size of the input data blocks is variable.

Figure 5C:
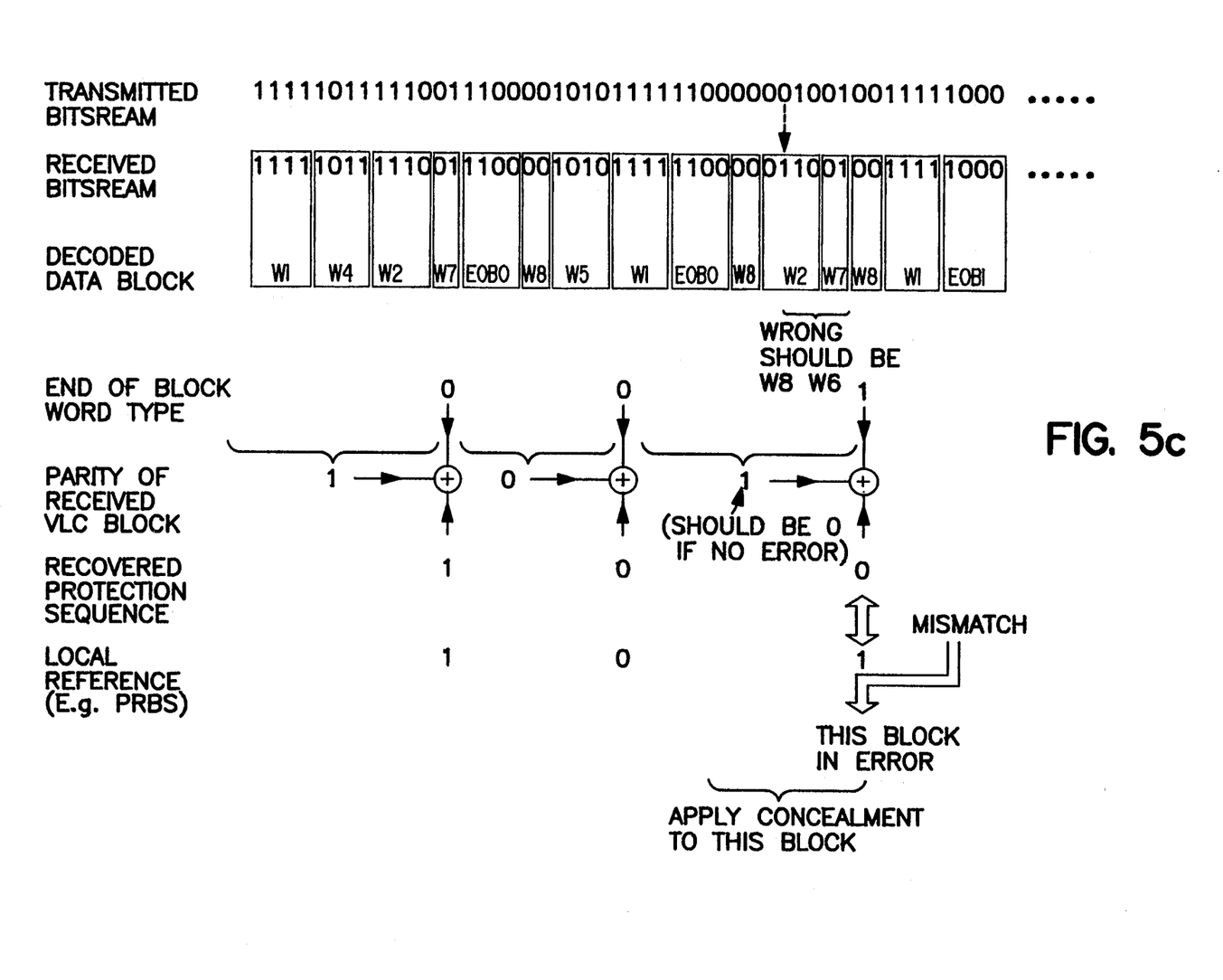
FIG. 5c illustrates how the structure of the data changes in a decoding process complementary to the coding process of FIG. 5c.

FIG. 5c shows how the structure of the bitstream changes as it is decoded by a method complementary to the coding of FIG. 5b and illustrates how errors may be detected. In this example an error in data block C has been detected and may be disguised by applying error concealment to data block C.

Although the specific embodiments that have been described above apply to coding/decoding schemes where the parameter used to characterize the groups of VLC codewords coding a data block is the parity of the totality of bits in the group of VLC codewords it is to be understood that, as mentioned above, other characterizing parameters may be used alternatively or additionally.

We claim:

1. Method for error protecting a digital bitstream, the digital bitstream comprising a plurality of variable length codewords (VLC), coding blocks of digital data, said blocks of data being delimited by end-of-block words (EOB), the method comprising:

generating bits of a reference pattern;

modulating respective (EOB) by single, or small groups of, bits of the reference pattern, said single, or small groups of, reference pattern bits comprising only a portion of the reference pattern;

the step of conditioning the single, or small group of, reference pattern bits modulating an (EOB) such that the conditioned bit, or bits, carry information relating to the VLC code words coding a corresponding data block; and wherein there are a plurality of available (EOB) and said step of modulating selects one of the available EOB words for use based on the value of the respective conditioned reference pattern bit, or bits.

2. A method according to claim 1, wherein the conditioning step is adapted to condition the reference pattern bit or bits such that the conditioned bit or bits carry information relating to codewords coding the preceding data block.

3. A method according to claim 1, wherein the conditioning step comprises generating a signal representing a characteristic of the VLC code words which code a data block and modulating, by said characteristic signal, the reference bit, or bits, which modulate the corresponding end-of block word.

4. A method according to claim 3, wherein the value of said characteristic signal represents a modulo n count of the number of VLC code words which code the corresponding data block, where $n=2^m$, and m is an integer.

5. A method according to claim 4, wherein the value of m is 1.

6. A method according to claim 3, wherein the value of said characteristic signal represents a modulo n count of the bits that are set to 1 in the VLC code words which code the corresponding data block, where $n=2^m$, and m is an integer.

7. A method according to claim 6, wherein the value of m is 1.

8. Apparatus for error-protecting a digital bitstream, the digital bitstream comprising a plurality of variable length codewords (VLC), coding blocks of digital data, said blocks of data being delimited by end-of-block words (EOB), the apparatus comprising:

means for generating bits of a reference pattern;

means for modulating respective (EOB) by single, or small groups of, bits of the reference pattern, said single, or small groups of, reference pattern bits comprising only a portion of the reference pattern;

means for conditioning the single, or small group of, reference pattern bits modulating an (EOB) such that the conditioned bit, or bits, carry information relating to the VLC code words coding a corresponding data block; and said means for modulating selects one of a plurality of available for use, and based on the value of the respective conditioned reference pattern bit, or bits.

9. Apparatus according to claim 8, wherein the modulating means is adapted to append the conditioned reference pattern bit or bits to the respective end-of-block word (EOB).

10. Apparatus according to claim 8, wherein the conditioning means (6) is adapted to condition the reference pattern bit, or bits, such that the conditioned bits carry information relating to VLC codewords coding the preceding data word.

11. Apparatus according to claim 8, wherein the means (3) for generating reference pattern bits comprises means for generating a pseudo-random binary sequence.

12. Apparatus according to claim 8, wherein the conditioning means (6) comprises means for generating a signal representing a characteristic of the VLC code words which code a data block and means for modulating, by said characteristic signal, the reference bit, or bits, which modulate the corresponding end-of-block word.

13. Apparatus according to claim 12, wherein the reference bit modulating means comprises means for applying a logical exclusive OR function to the reference pattern bit or bits and the characteristic signal.

14. Apparatus according to claim 12, wherein the characteristic signal generating means comprises means for modulo n counting the number of VLC codewords coding a data block, where $n=2^m$ and m is an integer.

15. Apparatus according to claim 14, wherein the value of m is 1.

16. Apparatus according to claim 12, wherein the characteristic signal generating means comprises means for modulo n counting the bits that are set to 1 in the VLC code words coding a data block, where $n=2^m$ and m is an integer.

17. Apparatus according to claim 16, wherein the value of m is 1.

18. Method for decoding an error-protected digital bitstream, the digital bitstream comprising variable length codewords (VLC), coding blocks of digital data, the data blocks being delimited by modulated end-of-block words (EOB), the (EOB) being modulated by conditioned bits of a reference pattern such that respective (EOB) are modulated by single, or small groups of, bits representing only a portion of the reference pattern and said bits are conditioned to carry information relating to VLC codewords coding a corresponding data block, the method comprising the steps of;

processing respective modulated (EOB) to recover respective conditioned reference pattern bit, or bits;

evaluating, from VLC codewords coding respective data blocks in said error-protected bitstream, said information relating to the VLC codewords;

generating the respective recovered conditioned reference pattern bit, or bits, with the corresponding evaluated information and generated reference pattern bit, or bits.

19. A method according to claim 18, and further comprising the step of selectively performing error concealment and/or correction on the data blocks in the digital bitstream depending upon the result of the comparing step.

20. A method according to claim 18, wherein the reference bit, or bits, modulating a respective end-of-block word is itself modulated by a signal representing a characteristic of the VLC codewords which code the corresponding data block, the evaluating step is adapted to evaluate said characteristic of the VLC codewords in the error-protected bitstream which code a respective data block, so as to produce an evaluated characteristic signal, and the comparing step comprises demodulating recovered reference pattern bits by the respective evaluate characteristic signal and comparing the demodulated recovered reference pattern bits with the generated reference pattern bits.

21. A method according to claim 20, wherein the evaluating step comprises modulo n counting the number of VLC codewords coding a respective data block of the digital bitstream, where $n=2^m$ and m is an integer.

22. A method according to claim 21, wherein the value of m is 1.

23. A method according to claim 20, wherein the evaluating step comprises modulo n counting the bits that are set to 1 in the VLC codewords coding a respective data block of the digital bitstream, wherein $n=2^m$ and m is an integer.

24. A method according to claim 23, wherein the value of m is 1.

25. Apparatus for decoding an error-protected digital bitstream, the digital bitstream comprising variable length codewords (VLC) coding blocks of digital data, the data blocks being delimited by modulated end-of-block words (EOB), the (EOB) being modulated by conditioned bits of a reference pattern such that respective (EOB) are modulated by single, or small groups of, bits representing only a portion of the reference pattern and said bits are conditioned to carry information relating to VLC codewords coding corresponding data blocks, the apparatus comprising:

demodulating means for processing the modulated (EOB) to recover the respective conditioned reference pattern bit, or bits;

means for evaluating, from VLC codewords coding a respective data block in the error-protected digital bitstream, said information relating to VLC codewords coding the data block;

means for generating bits of the reference pattern; and means for comparing the respective recovered conditioned reference pattern bit, or bits, with the corresponding evaluated information and generated reference pattern bit, or bits.

26. Apparatus according to claim 25, and further comprising error concealment and/or correction means (25–28) adapted to selectively conceal and/or correct errors in a data block dependent upon a signal output by the comparing means (20).

27. Apparatus according to claim 25, wherein the generating means (18) comprises means for generating a pseudo-random sequence.

28. Apparatus according to claim 25, wherein in the signal to be decoded, the reference pattern bit, or bits, modulating a respective end-of-block word is itself modulated by a signal representing a characteristic of the VLC codewords which code the corresponding data block, and wherein the evaluating means (12) is adapted to evaluate said characteristic of the VLC codewords in the digital bitstream which code a respective data block and to produce an evaluated characteristic signal, and the comparing means (16–20) comprises means (16) for demodulating the recovered reference pattern bits by respective evaluated characteristic signals and means (20) for comparing the demodulated recovered reference pattern bits with generated reference pattern bits.

29. Apparatus according to claim 28, wherein the evaluating means (12) comprises means for modulo n counting the bits that are set to 1 in the VLC code words which code a corresponding data block, where $n=2^m$ and m is an integer.

30. Apparatus according to claim 28, wherein the evaluating means (12) comprises means for modulo n counting the number of VLC codewords which code a corresponding data block, where $n=2^m$ and m is an integer.

31. Apparatus according to claim 30, where m is equal to 1.

32. An error-protected digital bitstream, comprising variable length codewords (VLC), coding digital data blocks, the digital data blocks being delimited by modulated end-of-block words (EOB), respective (EOB) being modulated by single, or small groups of, bits of a reference pattern, said single, or small groups of, bits representing only a portion of the reference pattern, wherein the modulated reference pattern bit, or bits, is further modulated by a signal representing a characteristic of the VLC code words which code the corresponding data block, the single, or small group of, reference pattern bits modulating a respective (EOB) are conditioned to carry information on the VLC codewords coding a corresponding data block.

33. An error protected digital bitstream according to claim 32, wherein said reference pattern comprises a pseudo-random binary sequence.

34. An error-protected digital bitstream according to claim 32, wherein said characteristic is a modulo n count of the number of VLC code words which code the data block, where $n=2^m$ and m is an integer.

35. An error-protected digital bitstream according to claim 34, wherein m is equal to 1.

36. An error-protected digital bitstream according to claim 32, wherein said characteristic is a modulo n count of the bits that are set to 1 in the VLC codewords which code the data block, where $n=2^m$ and m is an integer.

37. An error-protected digital bitstream according to claim 36, wherein m is equal to 1.

38. Method for error protecting a digital bitstream, the digital bitstream comprising a plurality of variable length codewords (VLC), coding blocks of digital data, said blocks of data being delimited by end-of-block words (EOB), the method comprising:
generating bits of a reference pattern;
modulating respective (EOB) by single, or small groups of, bits of the reference pattern, said single, or small groups of, reference pattern bits comprising only a portion of the reference pattern and said step of modulating is adapted to modulate each (EOB) word by appending thereto the corresponding conditioned reference pattern bit, or bits; and
the step of conditioning the single, or small group of, reference pattern bits modulating an (EOB) such that the conditioned bit, or bits, carry information relating to the VLC code words coding a corresponding data block.

39. Apparatus for error-protecting a digital bitstream, the digital bitstream comprising a plurality of variable length codewords (VLC), coding blocks of digital data, said blocks of data being delimited by end-of-block words (EOB), the apparatus comprising:
means for generating bits of a reference pattern;
means for modulating respective (EOB) by single, or small groups of, bits of the reference pattern, said single, or small groups of, reference pattern bits comprising only a portion of the reference pattern
means for conditioning the single, or small group of, reference pattern bits modulating an (EOB) such that the conditioned bit, or bits, carry information relating to the VLC code words coding a corresponding data block; and
said means for modulating appends the conditioned reference pattern bit, or bits, to the respective EOB.

* * * * *